(12) United States Patent
Sherk

(10) Patent No.: US 11,887,259 B2
(45) Date of Patent: Jan. 30, 2024

(54) METHOD, SYSTEM, AND APPARATUS FOR FULL-BODY TRACKING WITH MAGNETIC FIELDS IN VIRTUAL REALITY AND AUGMENTED REALITY APPLICATIONS

(71) Applicant: Walker L. Sherk, Raleigh, NC (US)

(72) Inventor: Walker L. Sherk, Raleigh, NC (US)

( * ) Notice: Subject to any disclaimer, the term of this patent is extended or adjusted under 35 U.S.C. 154(b) by 303 days.

(21) Appl. No.: 17/243,501

(22) Filed: Apr. 28, 2021

(65) Prior Publication Data

US 2022/0237874 A1    Jul. 28, 2022

Related U.S. Application Data

(60) Provisional application No. 63/141,131, filed on Jan. 25, 2021.

(51) Int. Cl.
| | |
|---|---|
| *G06T 19/00* | (2011.01) |
| *G01R 33/028* | (2006.01) |
| *G06F 3/01* | (2006.01) |

(52) U.S. Cl.
CPC ........ *G06T 19/006* (2013.01); *G01R 33/0286* (2013.01); *G06F 3/012* (2013.01); *G06F 3/014* (2013.01)

(58) Field of Classification Search
CPC ... G06T 19/006; G01R 33/0286; G06F 3/012; G06F 3/014; G06F 3/011
See application file for complete search history.

(56) References Cited

U.S. PATENT DOCUMENTS

| | | | |
|---|---|---|---|
| 8,786,680 B2 | 7/2014 | Shiratori et al. | |
| 8,988,438 B2* | 3/2015 | Bang | G06V 40/23 345/473 |
| 9,372,534 B2 | 6/2016 | Santos Paiva Ferraz da Conceicao | |
| 9,582,072 B2 | 2/2017 | Connor | |
| 10,234,934 B2 | 3/2019 | Connor | |
| 10,321,873 B2* | 6/2019 | Connor | A61B 5/6831 |
| 10,415,975 B2 | 9/2019 | Bellusci et al. | |
| 10,437,335 B2 | 10/2019 | Daniels | |
| 10,549,153 B2 | 2/2020 | Fung | |

(Continued)

FOREIGN PATENT DOCUMENTS

WO    2020023421    1/2020

OTHER PUBLICATIONS

International Search Report and Written Opinion issued in corresponding International Application No. PCT/US2022/13246 dated Apr. 18, 2022.

*Primary Examiner* — Chong Wu
(74) *Attorney, Agent, or Firm* — Jeffrey C. Watson, Esq.; Grell & Watson Patent Attorneys LLC.

(57) ABSTRACT

A system configured for full-body tracking with magnetic fields in virtual reality ("VR") and augmented reality ("AR") applications includes at least one tracker, at least one wearable article, and a computational device. Each of the at least one trackers hosts a joint sensor suite. The joint sensor suite is configured to track positions, orientations, and joint angles of a joint along a body. Each of the at least one trackers is configured to be attached to the body. Each of the at least one wearable articles is configured to enable one of the at least one trackers to be fastened to the joint along the body. The computational device is configured to capture real-time user generated movements via each of the at least one trackers and digitize user poses and body positions.

17 Claims, 3 Drawing Sheets

(56) References Cited

U.S. PATENT DOCUMENTS

| | | |
|---|---|---|
| 10,691,199 B2 | 6/2020 | Shanware |
| 10,802,576 B2 | 10/2020 | Simstad |
| 2009/0278791 A1 | 11/2009 | Slycke et al. |
| 2012/0046901 A1 | 2/2012 | Green et al. |
| 2014/0135960 A1 | 5/2014 | Choi |
| 2014/0219550 A1 | 8/2014 | Popa et al. |
| 2015/0366504 A1 | 12/2015 | Conner |
| 2017/0123487 A1 | 5/2017 | Hazra et al. |
| 2018/0052512 A1 | 2/2018 | Overly |
| 2018/0342109 A1* | 11/2018 | Hamidi-Rad ........ A61B 5/1071 |
| 2019/0369728 A1 | 12/2019 | Rogers et al. |
| 2020/0375497 A1 | 12/2020 | Jin et al. |
| 2021/0020062 A1 | 1/2021 | Kur et al. |
| 2021/0389829 A1* | 12/2021 | Erivantcev .............. H02J 7/342 |

* cited by examiner

METHOD, SYSTEM, AND APPARATUS FOR FULL-BODY TRACKING WITH MAGNETIC FIELDS IN VIRTUAL REALITY AND AUGMENTED REALITY APPLICATIONS

CROSS-REFERENCE TO RELATED APPLICATIONS

This application claims benefit of priority application, U.S. Provisional Ser. No. 63/141,131 filed Jan. 25, 2021, entitled "Method and Apparatus for Full-body Tracking with Magnetic Fields in Virtual Reality and Augmented Reality Applications", which is incorporated herein by reference in its entirety.

FIELD OF THE DISCLOSURE

The present disclosure is directed toward virtual reality ("VR") and augmented reality ("AR") applications. More specifically, the present disclosure is directed toward methods, systems, and apparatuses for full-body tracking with magnetic fields in virtual reality ("VR") and augmented reality ("AR") applications.

BACKGROUND

Generally speaking, virtual reality, also known as "VR", is a simulated experience that can be similar to or completely different from the real world. Applications of virtual reality include entertainment (e.g. video games) and education (e.g. medical or military training). Other distinct types of VR-style technology include augmented reality, also known as "AR", and mixed reality, sometimes referred to as extended reality or XR. Virtual reality may be defined as the computer-generated simulation of a three-dimensional image or environment that can be interacted with in a seemingly real or physical way by a person using special electronic equipment, such as a helmet with a screen inside or gloves fitted with sensors. Likewise, augmented reality is a technology that superimposes a computer-generated image on a user's view of the real world, thus providing a composite view. AR adds digital elements to a live view often by using the camera on a smartphone. Examples of augmented reality experiences include Snapchat lenses and the game Pokemon Go. VR, on the other hand, implies a complete immersion experience that shuts out the physical world. While VR is more immersive, AR provides more freedom for the user and more possibilities for marketers because it does not need to include a head-mounted display.

Currently, standard virtual reality systems use either virtual reality headsets or multi-projected environments to generate realistic images, sounds and other sensations that simulate a user's physical presence in a virtual environment. A person using virtual reality equipment is able to look around the artificial world, move around in it, and interact with virtual features or items. The effect is commonly created by VR headsets consisting of a head-mounted display with a small screen in front of the eyes. Virtual reality typically incorporates auditory and video feedback, but may also allow other types of sensory and force feedback through haptic technology. Virtual reality is most commonly used in entertainment applications such as video games and 3D cinema. In social sciences and psychology, virtual reality offers a cost-effective tool to study and replicate interactions in a controlled environment. VR can also be used as a form of therapeutic intervention.

Modern virtual reality headset displays are based on technology like gyroscopes and motion sensors for tracking head, body, and hand positions, small HD screens for stereoscopic displays, and small, lightweight and fast computer processors. These components led to relative affordability for independent VR developers. Independent production of VR images and video has increased alongside the development of affordable omnidirectional cameras, also known as 360-degree cameras or VR cameras, which have the ability to record 360 interactive photography, although at relatively low resolutions or in highly compressed formats for online streaming of 360 video. In contrast, photogrammetry is increasingly used to combine several high-resolution photographs for the creation of detailed 3D objects and environments in VR applications.

To create a feeling of immersion, special output devices are needed to display virtual worlds. Well-known formats include head-mounted displays or the CAVE. In order to convey a spatial impression, two images are generated and displayed from different perspectives (stereo projection).

Special input devices are required for interaction with the virtual world. Currently, these include the 3D mouse, the wired glove, motion controllers, and optical tracking sensors. Controllers typically use optical tracking systems (primarily infrared cameras) for location and navigation, so that the user can move freely without wiring. Some input devices provide the user with force feedback to the hands or other parts of the body, so that the human being can orientate himself in the three-dimensional world through haptics and sensor technology as a further sensory sensation and carry out realistic simulations. This allows for the viewer to have a sense of direction in the artificial landscape. Additional haptic feedback can be obtained from omnidirectional treadmills (with which walking in virtual space is controlled by real walking movements) and vibration gloves and suits.

As may always be the case with technology, the need and desire to make virtual reality and augmented reality better and more immersive is always present. The present disclosure thus recognizes the need to create better input devices that allow for improvements in VR and AR for better and/or more immersive experiences. More specifically, the present disclosure recognizes the problem that current input devices require external observers, lighthouses, or base stations to track movement. In addition, with current input devices errors may occur when limbs overlap or cross due to requirement for line of sight tracking. Accordingly, the present disclosure recognizes the need to provide full-body tracking via input devices that is faster and provides more accurate VR and AR experiences without the need for line of sight tracking from external observers, lighthouses or base stations to track movement.

The instant disclosure may be designed to address at least certain aspects of the problems or needs discussed above by providing methods, systems, and apparatuses for full-body tracking with magnetic fields in VR and AR applications.

SUMMARY

The present disclosure may solve the aforementioned limitations of the currently available devices, systems, trackers and methods for VR and/or AR systems and applications, by providing a system configured for full-body tracking. The system for full-body tracking may generally include at least one tracker, at least one wearable article, and a computational device. Each of the at least one trackers may host a joint sensor suite. The joint sensor suite may be configured to track positions, orientations, and joint angles of a joint along a body. Each of the at least one trackers may be configured to be attached to the body. Each of the at least one wearable articles may be configured to enable one of the at least one trackers to be fastened to the joint along the body. The computational device may be configured to capture real-time user generated movements via each of the at least one trackers and digitize user poses and body positions.

One feature of the disclosed system for full-body tracking may be that the computational device can be configured to capture the real-time user generated movements via each of the at least one trackers and digitize the user poses and body positions without the need for external observers, lighthouses, or base stations.

Another feature of the disclosed system for full-body tracking may be that the system can be configured for full-body applications in virtual reality or augmented reality applications as well as recording pose data for motion capture, animation, and health and fitness applications.

In select embodiments of the disclosed system for full-body tracking, the computational device may be a computer, a smartphone, a game system, a VR headset, an AR headset, the like, or combinations thereof.

Another feature of the disclosed system for full-body tracking may be that the system can be designed and configured to fulfill standard tracking requirements without requiring an existence of external observers, light houses, or base stations.

Another feature of the disclosed system for full-body tracking may be that the system can be designed and configured to track a position of the body without errors from the placement and location of feet, legs, and arms when limbs overlap or cross.

Another feature of the disclosed system for full-body tracking may be that the system can be designed and configured to track an actual position and angle of a joint instead of calculating possible locations given the position of trackers which simply know their own location.

Another feature of the disclosed system for full-body tracking may be that the system can be designed and configured to capture pose data both in real-time and in recorded form.

Another feature of the disclosed system for full-body tracking may be that the system can be designed and configured to not require a line of sight in order to operate.

Another feature of the disclosed system for full-body tracking may be that the system can be designed and configured to not have location loss drifting that causes virtual body parts to fly away from virtual avatars when tracking is lost.

Another feature of the disclosed system for full-body tracking may be that the system can be designed and configured to work with all existing virtual reality and augmented reality devices without any modification to headsets or environments.

Another feature of the disclosed system for full-body tracking may be that the system can be designed and configured to track a position and orientation of a tracker which needs calibration to be linked to the skeleton, wherein the system is configured to allow for actual joint angles and orientations to be identified in real-time.

In select embodiments of the disclosed system for full-body tracking, the joint sensor suite for each of the at least one trackers may include a magnetic field sensor and at least one magnet. The magnetic field sensor may be on a first limb of the joint. The at least one magnet may be on at least one second limb of the joint. In select embodiments, the magnetic field sensor may be a small-scale microelectromechanical system (MEMS) magnetic field sensor. In select embodiments of the disclosed system for full-body tracking, the joint sensor suite for each of the at least one trackers may further include an accelerometer, and a gyroscope. Wherein, the joint sensor suite for each of the at least one trackers may be configured to track acceleration, orientation, magnetic field strength, and magnetic field polarity.

Another feature of the disclosed system for full-body tracking may be that the computational device can be configured to calculate observed values for each joint of the body. The observed values may include, but are clearly not limited to, a polarity of earth, a gravity vector, and skeletal bone lengths. Each of the observed values may all be assumed to be constant once they have been generated. Whereby the observed values may be configured to be leveraged to orient, calculate joint angles, error correct, and calibrate the system without any application driven requirements.

Another feature of the disclosed system for full-body tracking may be that the computational device can be configured to calculate the joint angle, the joint orientation, the joint position, a parent joint position, and a child joint position in real-time. Where the parent joint position may be a proximal body joint that is closer on the limbs of a spine of the body, and the child joint position may be a distal body joint that is further away from the spine.

In select embodiments of the disclosed system for full-body tracking the at least one trackers may include a head tracker, a left upper arm tracker, a left elbow tracker, a left wrist tracker, a right upper arm tracker, a right elbow tracker, a right wrist tracker, a hips tracker, a left upper leg tracker, a left knee tracker, a left ankle tracker, a right upper leg tracker, a right knee tracker, a right ankle tracker, the like, and any various combinations thereof. The head tracker may have a head joint sensor suite configured to track the position, orientation, and joint angle of the head. The left upper arm tracker may have a left upper arm sensor suite configured to track the position, orientation, and joint angle of the left upper arm. The left elbow tracker may have a left elbow sensor suite configured to track the position, orientation, and joint angle of the left elbow. The left wrist tracker may have a left wrist sensor suite configured to track the position, orientation, and joint angle of the left wrist. The right upper arm tracker may have a right upper arm sensor suite configured to track the position, orientation, and joint angle of the right upper arm. The right elbow tracker may have a right elbow sensor suite configured to track the position, orientation, and joint angle of the right elbow. The right wrist tracker may have a right wrist sensor suite configured to track the position, orientation, and joint angle of the right wrist. The hips tracker may have a hips joint sensor suite configured to track the position, orientation, and joint angle of the hips. The left upper leg tracker may have a left upper leg sensor suite configured to track the position, orientation, and joint angle of the left upper leg. The left knee tracker may have a left knee sensor suite configured to track the position, orientation, and joint angle of the left knee. The left ankle tracker may have a left ankle sensor suite configured to track the position, orientation, and joint angle of the left ankle. The right upper leg tracker may have a right upper leg sensor suite configured to track the position, orientation, and joint angle of the right upper leg. The right knee tracker may have a right knee sensor suite configured to track the position, orientation, and joint angle of the right knee. The right ankle tracker may have a right ankle sensor suite configured to track the position, orientation, and joint angle of the right ankle.

In select embodiments of the disclosed system for full-body tracking, the computational device may be wired to each sensor suite of each of the at least one trackers.

In other select embodiments of the disclosed system for full-body tracking, the computational device may be a separate device.

In select embodiments of the disclosed system for full-body tracking, the computational device may be configured to communication with a headset and/or a controller. This communication with the headset and/or the controller may be configured for collecting position/orientation data, a headset location, and/or a controller location from the headset, the controller, or a combination thereof. Wherein, the headset and/or the controller may be a VR/AR headset and/or a VR/AR controller, respectively.

In select embodiments of the disclosed system for full-body tracking, the computational device can be configured to send the digitize poses and body positions to a virtual reality or augmented reality application.

In other select embodiments of the disclosed system for full-body tracking, the computational device can be configured to send the digitize poses and body positions to a motion recording device configured for animation keyframes.

In another aspect, the instant disclosure embraces a system configured for full-body tracking in any of the various embodiments and/or combination of embodiments shown and/or described herein.

In another aspect, the instant disclosure embraces a tracker device for full-body tracking in virtual reality and augmented reality applications. The tracker device may be any of the embodiments and/or combination of embodiments of the at least one tracker devices for the disclosed system for full-body tracking shown and/or described herein. Accordingly, in select embodiments, the tracker device may generally include a joint sensor suite. The joint sensor suite may be configured to track positions, orientations, and joint angles of a joint along a body. The joint sensor suite for the tracker device may include a magnetic field sensor on a first limb of the joint and at least one magnet on at least one second limb of the joint. Wherein, the joint sensor suite for the tracker device is configured to track acceleration, orientation, magnetic field strength, and magnetic field polarity.

In select embodiments of the disclosed tracker device, the magnetic field sensor may be a small-scale microelectromechanical system (MEMS) magnetic field sensor.

In select embodiments of the disclosed tracker device, the joint sensor suite may further include an accelerometer, and a gyroscope.

In select embodiments, the disclosed tracker device may further include a wearable article. The wearable articles may be configured to enable the tracker device to be fastened to the joint along the body.

In select embodiments, the disclosed tracking device may be a head tracker, a left upper arm tracker, a left elbow tracker, a left wrist tracker, a right upper arm tracker, a right elbow tracker, a right wrist tracker, a hips tracker, a left upper leg tracker, a left knee tracker, a left ankle tracker, a right upper leg tracker, a right knee tracker, a right ankle tracker, and/or the like. The head tracker may have a head joint sensor suite configured to track the position, orientation, and joint angle of the head. The left upper arm tracker may have a left upper arm sensor suite configured to track the position, orientation, and joint angle of the left upper arm. The left elbow tracker may have a left elbow sensor suite configured to track the position, orientation, and joint angle of the left elbow. The left wrist tracker may have a left wrist sensor suite configured to track the position, orientation, and joint angle of the left wrist. The right upper arm tracker may have a right upper arm sensor suite configured to track the position, orientation, and joint angle of the right upper arm. The right elbow tracker may have a right elbow sensor suite configured to track the position, orientation, and joint angle of the right elbow. The right wrist tracker may have a right wrist sensor suite configured to track the position, orientation, and joint angle of the right wrist. The hips tracker may have a hips joint sensor suite configured to track the position, orientation, and joint angle of the hips. The left upper leg tracker may have a left upper leg sensor suite configured to track the position, orientation, and joint angle of the left upper leg. The left knee tracker may have a left knee sensor suite configured to track the position, orientation, and joint angle of the left knee. The left ankle tracker may have a left ankle sensor suite configured to track the position, orientation, and joint angle of the left ankle. The right upper leg tracker may have a right upper leg sensor suite configured to track the position, orientation, and joint angle of the right upper leg. The right knee tracker may have a right knee sensor suite configured to track the position, orientation, and joint angle of the right knee. The right ankle tracker may have a right ankle sensor suite configured to track the position, orientation, and joint angle of the right ankle.

In another aspect, the instant disclosure embraces a method of full-body tracking for VR and/or AR related applications. The disclosed method may generally include utilizing the disclosed system for full-body tracking in any of the embodiments and/or combination of embodiments shown and/or described herein.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The present disclosure will be better understood by reading the Detailed Description with reference to the accompanying drawings, which are not necessarily drawn to scale, and in which like reference numerals denote similar structure and refer to like elements throughout, and in which.

It is to be noted that the drawings presented are intended solely for the purpose of illustration and that they are, therefore, neither desired nor intended to limit the disclosure to any or all of the exact details of construction shown, except insofar as they may be deemed essential to the claimed disclosure.

DETAILED DESCRIPTION

Figure 1:
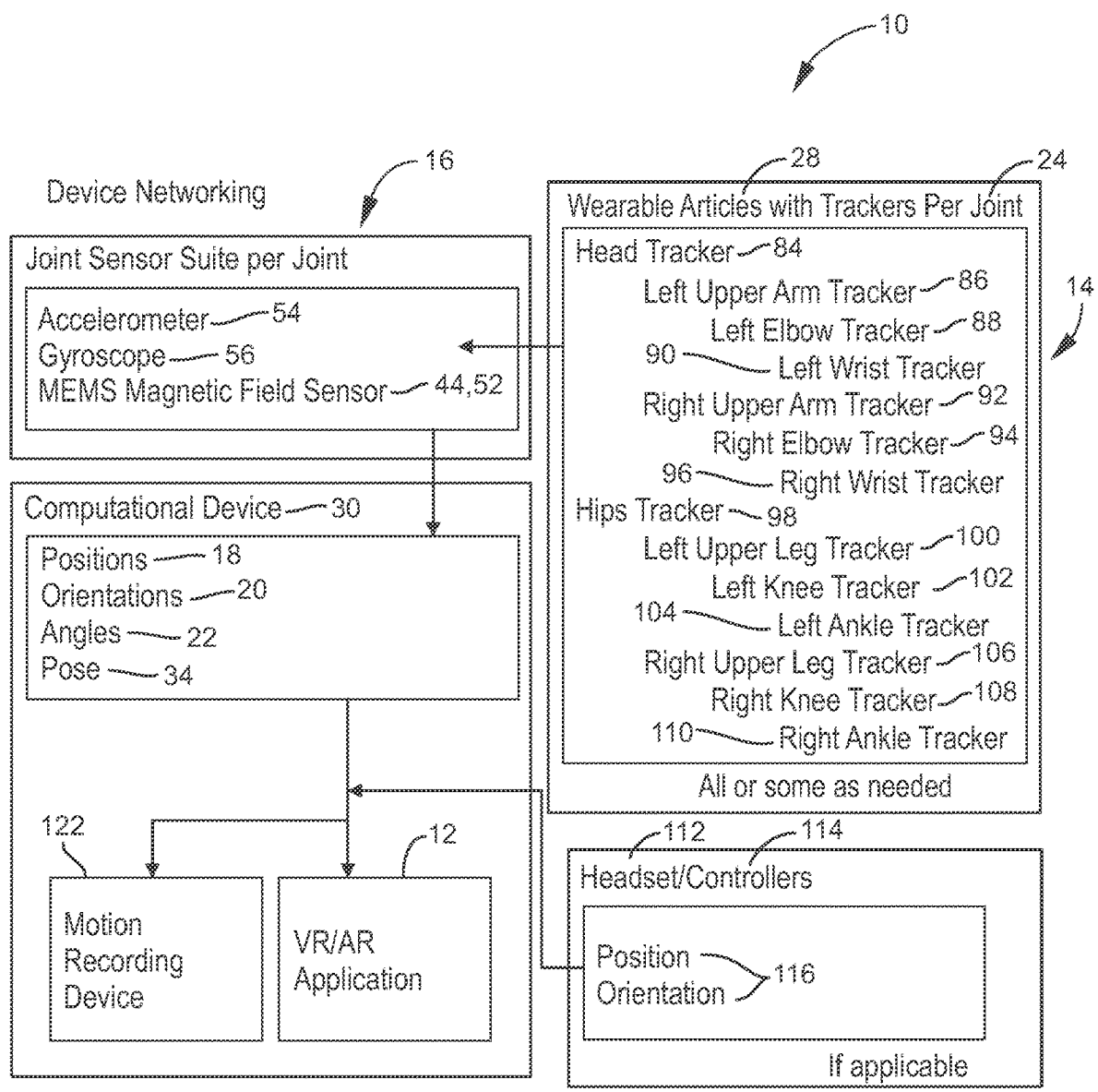
FIG. 1 is a block diagram of the disclosed methods, systems, and apparatuses for full-body tracking with magnetic fields in virtual reality ("VR") and augmented reality ("AR") applications according to select embodiments of the instant disclosure showing a description of the function of each device in the system.
Figure 2:
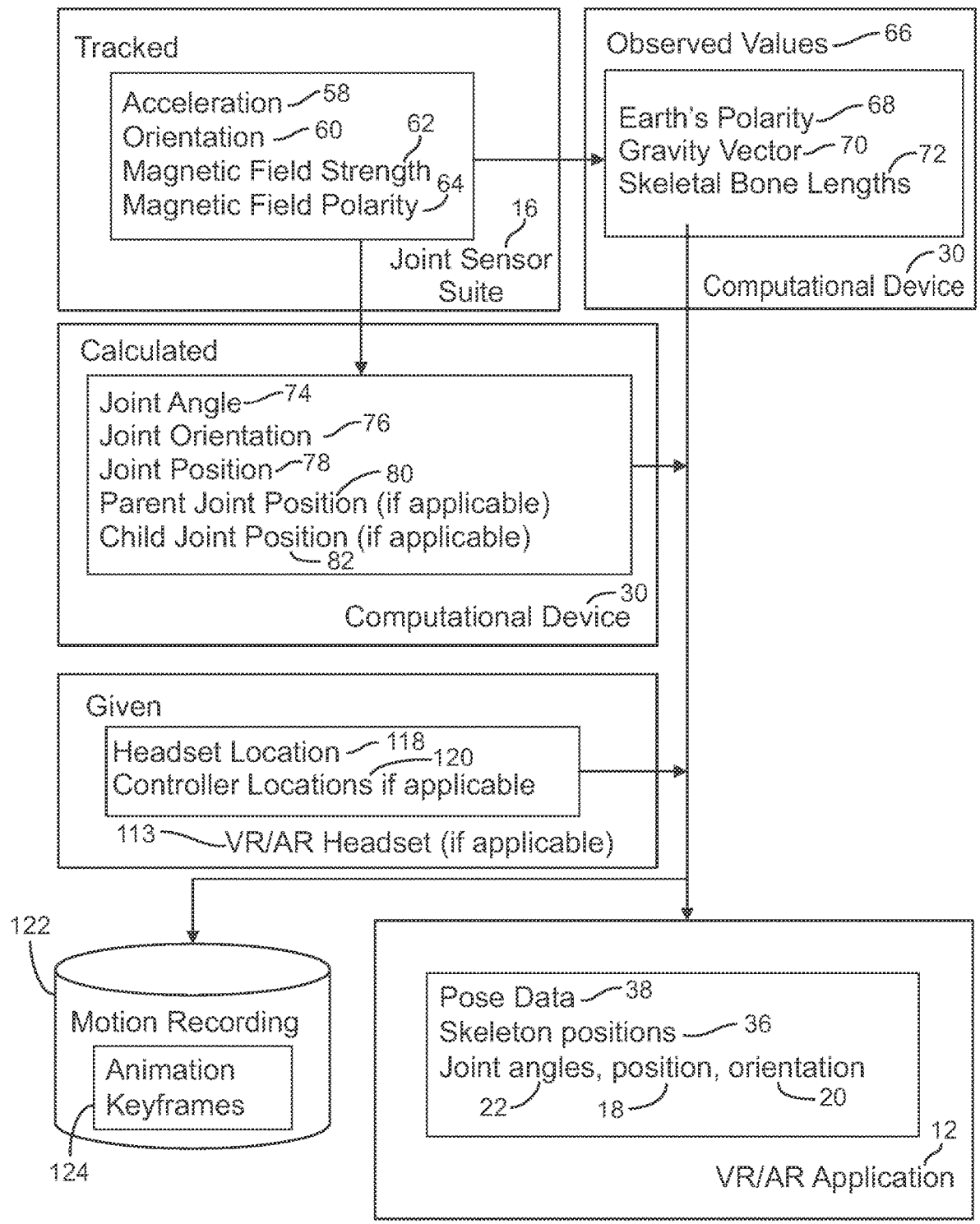
FIG. 2 is a block diagram of the disclosed methods, systems, and apparatuses for full-body tracking with magnetic fields in VR and AR applications according to select embodiments of the instant disclosure showing the data pipeline of how the disclosure converts raw data into application actionable tracking data.
Figure 3:
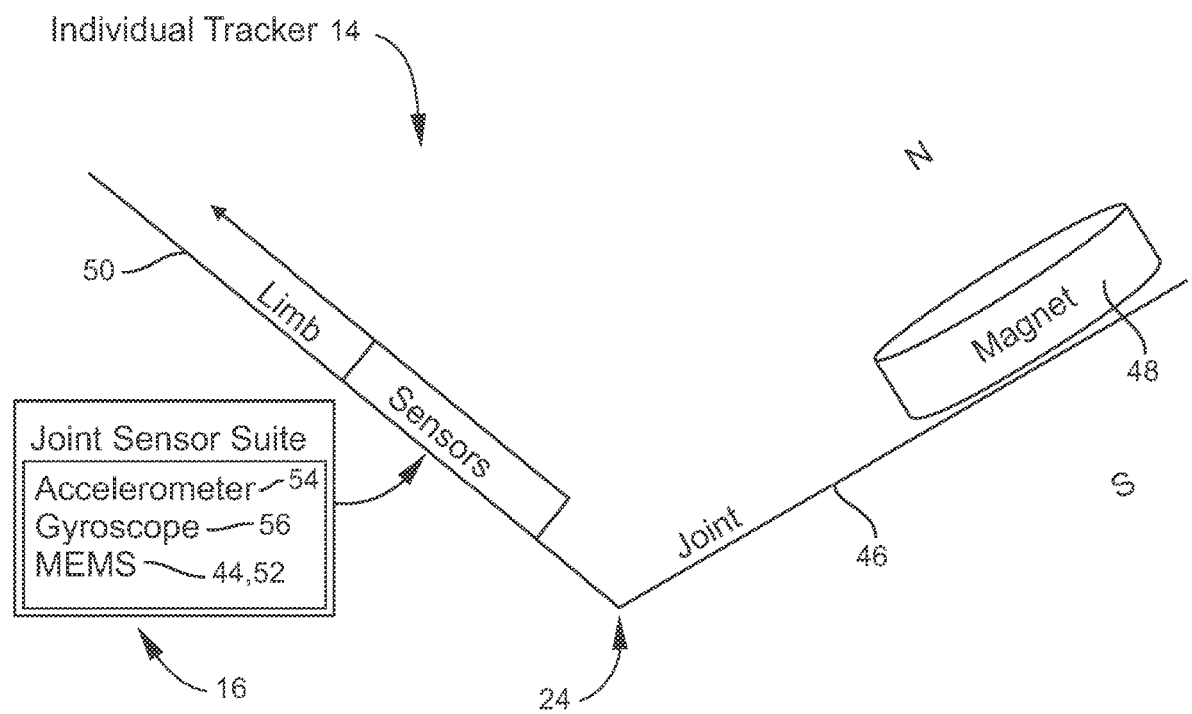
FIG. 3 is a schematic drawing of one individual joint sensor for the disclosed methods, systems, and apparatuses for full-body tracking with magnetic fields in VR and augmented AR applications according to select embodiments of the instant disclosure.

Referring now to FIGS. 1-3, in describing the exemplary embodiments of the present disclosure, specific terminology is employed for the sake of clarity. The present disclosure, however, is not intended to be limited to the specific terminology so selected, and it is to be understood that each specific element includes all technical equivalents that operate in a similar manner to accomplish similar functions. Embodiments of the claims may, however, be embodied in many different forms and should not be construed to be limited to the embodiments set forth herein. The examples set forth herein are non-limiting examples and are merely examples among other possible examples.

The present disclosure solves the aforementioned limitations of the currently available devices and methods of the currently available devices, systems, trackers and methods for VR and/or AR systems and applications, by providing system 10 configured for full-body tracking. System 10 may be utilized for providing full-body tracking for VR/AR applications 12 or the like. System 10 may be directed to enabling a standalone system which captures real-time user generated movements and digitizes user pose and body position without the need for external observers or lighthouses. Movements may be captured by a tracker 14 or multiple trackers 14 configured to track position, orientation, and joint angle of objects, arms, legs, torso, etc. The data captured by tracker 14 or multiple trackers 14 may then be transformed into digital pose information to drive applications. The result can be used for full-body applications in virtual reality and augmented reality applications 12 as well as recording pose data for motion capture, animation, and health and fitness applications.

System 10 for full-body tracking may generally include at least one tracker 14, at least one wearable article 28, and computational device 30. Each of the at least one trackers 14 may host joint sensor suite 16. Joint sensor suite 16 may be configured to track positions 18, orientations 20, joint angles 22, or the like, of joint 24 along a body (see FIG. 3). Each of the at least one trackers 14 may be configured to be attached to the body, like via each of the wearable articles 28. Each of the at least one wearable articles 28 may be configured to enable one of the at least one trackers 14 to be fastened to joint 24 along the body. Computational device 30 may be configured to capture real-time user generated movements via each of the at least one trackers 14 and digitize user poses 34 and body positions.

One feature of system 10 for full-body tracking may be that computational device 30 can be configured to capture the real-time user generated movements via each of the at least one trackers 14 and digitize user poses 34 and body positions without the need for external observers, lighthouses, or base stations.

Another feature of system 10 for full-body tracking may be that system 10 can be configured for full-body applications in virtual reality or augmented reality application 12 as well as recording pose data for motion capture, animation, and health and fitness applications, or the like.

Computational device 30 may be any desired computational device, computer, software, program, the like etc. In select embodiments of system 10 for full-body tracking, computational device 30 may be, but is not limited to, a computer, a smartphone, a game system, a VR and/or AR headset, the like, etc. As other examples, and clearly not limited thereto, computation device 30 may include an open-source electronic prototyping platform (like Arduino), a series of small single-board computers (like Pi like devices), the like, etc.

Another feature of system 10 for full-body tracking may be that system 10 can be designed and configured to fulfill standard tracking requirements without requiring an existence of external observers, light houses, or base stations.

Another feature of system 10 for full-body tracking may be that system 10 can be designed and configured to track a position of the body without errors from the placement and location of feet, legs, and arms when limbs overlap or cross.

Another feature of system 10 for full-body tracking may be that system 10 can be designed and configured to track an actual position and angle of joint 24 instead of calculating possible locations given the position of trackers 14 which simply know their own location.

Another feature of system 10 for full-body tracking may be that system 10 can be designed and configured to capture pose data both in real-time and in recorded form.

Another feature of system 10 for full-body tracking may be that system 10 can be designed and configured to not require a line of sight in order to operate.

Another feature of system 10 for full-body tracking may be that system 10 can be designed and configured to not have location loss drifting that causes virtual body parts to fly away from virtual avatars when tracking is lost.

Another feature of system 10 for full-body tracking may be that system 10 can be designed and configured to work with all existing virtual reality and augmented reality devices without any modification to headsets or environments.

Another feature of system 10 for full-body tracking may be that system 10 can be designed and configured to track a position and orientation of trackers 14 which needs calibration to be linked to the skeleton, wherein system 10 may be configured to allow for actual joint angles and orientations to be identified in real-time.

In select embodiments of system 10 for full-body tracking, system 10 may be designed and configured to: fulfill standard tracking requirements without requiring an existence of external observers, light houses, or base stations; track a position of the body without errors from the placement and location of feet, legs, and arms when limbs overlap or cross; track an actual position and angle of joint 24 instead of calculating possible locations given the position of trackers 14 which simply know their own location; capture pose data both in real-time and in recorded form; not require a line of sight in order to operate; not have location loss drifting that causes virtual body parts to fly away from virtual avatars when tracking is lost; work with all existing virtual reality and augmented reality devices without any modification to headsets or environments; and track a position and orientation of trackers 14 which needs calibration to be linked to the skeleton, wherein system 10 may be configured to allow for actual joint angles and orientations to be identified in real-time.

Referring to FIGS. 1 and 3, in select embodiments of system 10 for full-body tracking, joint sensor suite 16 for each of the at least one trackers 14 may include magnetic field sensor 44 and at least one magnet 48. As best shown in FIG. 3, magnetic field sensor 44 may be on first limb 46 of the joint. The at least one magnet 48 may be on at least one second limb 50 of joint 24. While most joints 24 will only require one second limb 50, some joints, like the hips, may require 2 joints with 2 magnets 48. Magnetic field sensor 44 may be any desired magnetic field sensor for sensing magnetic field strength 62, magnetic field polarity 64 (see FIG. 2), the like, and/or combinations thereof. In select possibly preferred embodiments, magnetic field sensor 44 may be small-scale microelectromechanical system (MEMS) magnetic field sensor 52. In select embodiments of system 10 for full-body tracking, joint sensor suite 16 for each of the at least one trackers 14 may further include accelerometer 54, gyroscope 56, the like, and/or combinations thereof. Accelerometer 54 may be any device configured for sensing and tracking acceleration 58. Gyroscope 56 may be any device configured for sensing and tracking orientation 60. Wherein, joint sensor suite 16 for each of the at least one trackers 14 may be configured to track acceleration 58, orientation 60, magnetic field strength 62, and magnetic field polarity 64.

Another feature of system 10 for full-body tracking may be that computational device 30 can be configured to calculate observed values 66 for each joint 24 of the body. The observed values 66 may be constant values observed or measure by system 10. Observed values 66 may include, but are clearly not limited to, polarity of earth 68, gravity vector 70, skeletal bone lengths 72 (of each joint 24), the like, and/or combinations thereof. Each of observed values 66 may all be assumed to be constant once they have been generated within system 10. Whereby, observed values 66 may be configured to be leveraged to orient, calculate joint angles, error correct, and calibrate system 10 without any application driven requirements.

Another feature of system 10 for full-body tracking may be that computational device 30 can be configured to calculate joint angle 74, joint orientation 76, joint position 78, parent joint position 80 (if applicable), and child joint position 82 (if applicable) in real-time. Where parent joint position 80 may be a proximal body joint that is closer on the limbs of a spine of the body, and the child joint position may be a distal body joint that is further away from the spine.

In select embodiments of system 10 for full-body tracking, the at least one trackers 14 may include head tracker 84, left upper arm tracker 86, left elbow tracker 88, left wrist tracker 90, right upper arm tracker 92, right elbow tracker 94, right wrist tracker 96, hips tracker 98, left upper leg tracker 100, left knee tracker 102, left ankle tracker 104, right upper leg tracker 106, right knee tracker 108, right ankle tracker 110, the like, and any various combinations thereof. Head tracker 84 may have a head joint sensor suite 16 configured to track the position, orientation, and joint angle of the head. Left upper arm tracker 86 may have a left upper arm sensor suite 16 configured to track the position, orientation, and joint angle of the left upper arm. Left elbow tracker 88 may have a left elbow sensor suite 16 configured to track the position, orientation, and joint angle of the left elbow. Left wrist tracker 90 may have a left wrist sensor suite 16 configured to track the position, orientation, and joint angle of the left wrist. Right upper arm tracker 92 may have a right upper arm sensor suite 16 configured to track the position, orientation, and joint angle of the right upper arm. Right elbow tracker 94 may have a right elbow sensor suite 16 configured to track the position, orientation, and joint angle of the right elbow. Right wrist tracker 96 may have a right wrist sensor suite 16 configured to track the position, orientation, and joint angle of the right wrist. Hips tracker 98 may have a hips joint sensor suite 16 configured to track the position, orientation, and joint angle of the hips. Left upper leg tracker 100 may have a left upper leg sensor suite 16 configured to track the position, orientation, and joint angle of the left upper leg. Left knee tracker 102 may have a left knee sensor suite 16 configured to track the position, orientation, and joint angle of the left knee. Left ankle tracker 104 may have a left ankle sensor suite 16 configured to track the position, orientation, and joint angle of the left ankle. Right upper leg tracker 106 may have a right upper leg sensor suite 16 configured to track the position, orientation, and joint angle of the right upper leg. Right knee tracker 108 may have a right knee sensor suite 16 configured to track the position, orientation, and joint angle of the right knee. Right ankle tracker 110 may have a right ankle sensor suite 16 configured to track the position, orientation, and joint angle of the right ankle.

In select embodiments of system 10 for full-body tracking, computational device 30 may be wired to each sensor suite 16 of each of the at least one trackers 14. However, the disclosure is not so limited, and in other select embodiments of system for full-body tracking, computational device 30 may be a separate device from sensor suite 16 of trackers 14.

In select embodiments of system 10 for full-body tracking, computational device 30 may be configured to communication with headset 112 and/or controller 114. This communication with headset 112 and/or controller 114 may be configured for collecting position/orientation data 116, headset location 118, and/or controller location 120 from headset 112, controller 114, the like, and/or a combination thereof. Wherein, headset 112 and/or controller 114 may be VR/AR headset 113 and/or a VR/AR controller, respectively.

In select embodiments of system 10 for full-body tracking, computational device 30 can be configured to send the digitize poses 34 and body positions to a virtual reality or augmented reality application 12. However, the disclosure is not so limited, and in other select embodiments of system 10 for full-body tracking, computational device 30 can be configured to send the digitize poses 34 and body positions to motion recording device 122 configured for animation keyframes 124.

In another aspect, the instant disclosure embraces system 10 configured for full-body tracking in any of the various embodiments and/or combination of embodiments shown and/or described herein.

Referring now specifically to FIG. 3, in another aspect, the instant disclosure embraces tracker device 14 for full-body tracking in virtual reality and augmented reality applications. Tracker device 14 may be any of the embodiments and/or combination of embodiments of the at least one tracker 14 for system 1—for full-body tracking as shown and/or described herein. Accordingly, in select embodiments, tracker device 14 may generally include joint sensor suite 16. Joint sensor suite 16 of tracker device 14 may be configured to track positions 18, orientations 20, and joint angles 22 of joint 24 along a body. Joint sensor suite 16 for tracker device 14 may include magnetic field sensor 44 on first limb 46 of joint 24 and at least one magnet 48 on at least one second limb 50 of joint 24. Wherein, joint sensor suite 16 for tracker device 14 may be configured to track acceleration 58, orientation 60, magnetic field strength 62, magnetic field polarity 64, the like, and/or combinations thereof through joint 24.

Magnetic field sensor 44 of tracker device 14 may be any desired magnetic field sensor for sensing magnetic field strength 62, magnetic field polarity 64 (see FIG. 2), the like, and/or combinations thereof. In select embodiments of tracker device 14, magnetic field sensor 52 may be small-scale microelectromechanical system (MEMS) magnetic field sensor 52.

In select embodiments of tracker device 14, joint sensor suite 16 may further include accelerometer 54, gyroscope 56, the like, and/or combinations thereof.

In select embodiments, tracker device 14 may further include wearable article 28. Wearable article 28 may be configured to enable tracker device 14 to be fastened to joint 24 along the body of the user. Wearable articles 28 may include any device, or devices, like articles of clothing, straps, bands, clips, adhesives, fasteners, the like, etc., configured for attaching tracker device 14 around joint 24 along the body of the user.

In select embodiments, tracking device 14 may be head tracker 84, left upper arm tracker 86, left elbow tracker 88, left wrist tracker 90, right upper arm tracker 92, right elbow tracker 94, right wrist tracker 96, hips tracker 98, left upper leg tracker 100, left knee tracker 102, left ankle tracker 104, right upper leg tracker 106, right knee tracker 108, right ankle tracker 110, the like, and any various combinations thereof. Head tracker 84 may have a head joint sensor suite 16 configured to track the position, orientation, and joint angle of the head. Left upper arm tracker 86 may have a left upper arm sensor suite 16 configured to track the position, orientation, and joint angle of the left upper arm. Left elbow tracker 88 may have a left elbow sensor suite 16 configured to track the position, orientation, and joint angle of the left elbow. Left wrist tracker 90 may have a left wrist sensor suite 16 configured to track the position, orientation, and joint angle of the left wrist. Right upper arm tracker 92 may have a right upper arm sensor suite 16 configured to track the position, orientation, and joint angle of the right upper arm. Right elbow tracker 94 may have a right elbow sensor suite 16 configured to track the position, orientation, and joint angle of the right elbow. Right wrist tracker 96 may have a right wrist sensor suite 16 configured to track the position, orientation, and joint angle of the right wrist. Hips tracker 98 may have a hips joint sensor suite 16 configured to track the position, orientation, and joint angle of the hips. Left upper leg tracker 100 may have a left upper leg sensor suite 16 configured to track the position, orientation, and joint angle of the left upper leg. Left knee tracker 102 may have a left knee sensor suite 16 configured to track the position, orientation, and joint angle of the left knee. Left ankle tracker 104 may have a left ankle sensor suite 16 configured to track the position, orientation, and joint angle of the left ankle. Right upper leg tracker 106 may have a right upper leg sensor suite 16 configured to track the position, orientation, and joint angle of the right upper leg. Right knee tracker 108 may have a right knee sensor suite 16 configured to track the position, orientation, and joint angle of the right knee. Right ankle tracker 110 may have a right ankle sensor suite 16 configured to track the position, orientation, and joint angle of the right ankle.

In another aspect, the instant disclosure embraces a method of full-body tracking for VR and/or AR related applications. The disclosed method may generally include utilizing the disclosed system for full-body tracking in any of the embodiments and/or combination of embodiments shown in FIGS. 1-3, and/or described herein.

Referring now specifically to FIG. 1, a description of the function of each device in system 10 is provided. The box for trackers 14 shows the potential joints 24 that can be tracked with system 10. Each joint 24 may be monitored with certain sensors as depicted by joint sensor suite 16. The resulting sensor outputs are all transmitted to computational device 30 which may be wired to the sensors or be a separate device. Depending on the application and availability and need of headset/controller data, like position/orientation data 116 of such a headset 112 or controller 114, computational device 30 may include data from VR/AR headset 113 and/or controller. The resulting tracking data is pushed to Application 12 (like a VR and/or AR application 12) and leveraged and/or recorded by motion recording device 122;

Referring now specifically to FIG. 2, the data pipeline of how system 10 converts raw data into application actionable tracking data is shown. The joint sensor suite 116 details the data tracked by each individual device and its host of sensors. Observed values 66 are shown that can be calculated from the output of sensors located at different joints. These values are assumed to be constant once they have been generated and can be leveraged to orient, calculate joint angles, error correct, and calibrate the device without any application driven requirements. Computational device 30 can then provide real-time calculations required by the use case which are ongoing as the trackers are used. Parent joint refers to the body joint that is closer on the limbs to the spine where child refers to the body joint that is further away from the spine. Additional information may be available from a VR or AR headset 113 and controllers. All the data may be compiled and sent to application 12 and or motion recording repository 122.

Referring specifically to FIG. 3, a detailed description of a single tracker 14 with a joint sensor suite 16 about one individual joint 24 is shown. The worn sensors of joint sensor suite 16 collect and pass information about joint 24. Magnet 48 represents a source of a magnetic field which is measured by MEMS magnetic field sensor 52.

In the specification and/or figures, typical embodiments of the disclosure have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The foregoing description and drawings comprise illustrative embodiments. Having thus described exemplary embodiments, it should be noted by those skilled in the art that the within disclosures are exemplary only, and that various other alternatives, adaptations, and modifications may be made within the scope of the present disclosure. Merely listing or numbering the steps of a method in a certain order does not constitute any limitation on the order of the steps of that method. Many modifications and other embodiments will come to mind to one skilled in the art to which this disclosure pertains having the benefit of the teachings presented in the foregoing descriptions and the associated drawings. Although specific terms may be employed herein, they are used in a generic and descriptive sense only and not for purposes of limitation. Accordingly, the present disclosure is not limited to the specific embodiments illustrated herein but is limited only by the following claims.

The invention claimed is:

1. A system configured for full-body tracking comprising:
   at least one tracker, each of the at least one trackers hosts a joint sensor suite configured to track positions, orientations, and joint angles of a joint along a body, and each of the at least one trackers is configured to be attached to the body;
   the joint sensor suite for each of the at least one trackers including:
   a magnetic field sensor on a first limb of the joint and at least one magnet on at least one second limb of the joint;
   an accelerometer; and
   a gyroscope;

wherein, the joint sensor suite for each of the at least one trackers is configured to track acceleration, orientation, magnetic field strength, and magnetic field polarity of the joint along the body;

at least one wearable article, each of the at least one wearable articles is configured to enable one of the at least one trackers to be fastened to the joint along the body; and a computational device configured to capture real-time user generated movements via each of the at least one trackers and digitize user poses and body positions.

2. The system for full-body tracking according to claim 1, wherein the computational device is configured to capture the real-time user generated movements via each of the at least one trackers and digitize the user poses and the body positions without the need for external observers, lighthouses, or base stations, whereby the system is configured for full-body applications in virtual reality or augmented reality applications as well as recording pose data for motion capture, animation, and health and fitness applications.

3. The system for full-body tracking according to claim 1, wherein the computational device is a computer, a smartphone, a game system, a VR headset, an AR headset, or combinations thereof.

4. The system for full-body tracking according to claim 1, wherein the system is designed and configured to:
fulfill standard tracking requirements without requiring an existence of external observers, light houses, or base stations;
track a position of the body from the placement and location of feet, legs, and arms when limbs overlap or cross;
track an actual position and angle of a joint instead of calculating possible locations given the position of trackers which simply know their own location;
capture pose data both in real-time and in recorded form;
not require a line of sight in order to operate;
not have location loss drifting that causes virtual body parts to fly away from virtual avatars when tracking is lost;
work with virtual reality and augmented reality devices without any modification to headsets or environments; or
track a position and orientation of a tracker which needs calibration to be linked to the skeleton, wherein the system is configured to allow for actual joint angles and orientations to be identified in real-time.

5. The system for full-body tracking according to claim 4, wherein the system is designed and configured to:
fulfill standard tracking requirements without requiring an existence of external observers, external light houses, or base stations;
track a position of the body from the placement and location of feet, legs, and arms when limbs overlap or cross;
track an actual position and angle of a joint instead of calculating possible locations given the position of trackers which simply know their own location;
capture pose data both in real-time and in recorded form;
not require a line of sight in order to operate;
not have location loss drifting that causes virtual body parts to fly away from virtual avatars when tracking is lost;
work with virtual reality and augmented reality devices without any modification to headsets or environments; and
track a position and orientation of a tracker which needs calibration to be linked to the skeleton, wherein the system is configured to allow for actual joint angles and orientations to be identified in real-time.

6. The system for full-body tracking according to claim 1, wherein the magnetic field sensor is a small-scale microelectromechanical system (MEMS) magnetic field sensor.

7. The system for full-body tracking according to claim 1, wherein:
the computational device is configured to calculate observed values for each joint of the body, wherein the observed values including a polarity of earth, a gravity vector, and skeletal bone lengths that are all assumed to be constant once they have been generated, whereby the observed values are configured to be leveraged to orient, calculate joint angles, error correct, and calibrate the system without any application driven requirements; and
wherein the computational device is configured to calculate the joint angle, the joint orientation, the joint position, a parent joint position, and a child joint position in real-time, where the parent joint position is a proximal body joint that is closer on the limbs of a spine of the body, and the child joint position is a distal body joint that is further away from the spine.

8. The system for full-body tracking according to claim 1, wherein the at least one tracker being selected from the group consisting of:
a head tracker with a head joint sensor suite configured to track the position, orientation, and joint angle of the head;
a left upper arm tracker with a left upper arm sensor suite configured to track the position, orientation, and joint angle of the left upper arm;
a left elbow tracker with a left elbow sensor suite configured to track the position, orientation, and joint angle of the left elbow;
a left wrist tracker with a left wrist sensor suite configured to track the position, orientation, and joint angle of the left wrist;
a right upper arm tracker with a right upper arm sensor suite configured to track the position, orientation, and joint angle of the right upper arm;
a right elbow tracker with a right elbow sensor suite configured to track the position, orientation, and joint angle of the right elbow;
a right wrist tracker with a right wrist sensor suite configured to track the position, orientation, and joint angle of the right wrist;
a hips tracker with a hips joint sensor suite configured to track the position, orientation, and joint angle of the hips;
a left upper leg tracker with a left upper leg sensor suite configured to track the position, orientation, and joint angle of the left upper leg;
a left knee tracker with a left knee sensor suite configured to track the position, orientation, and joint angle of the left knee;
a left ankle tracker with a left ankle sensor suite configured to track the position, orientation, and joint angle of the left ankle;
a right upper leg tracker with a right upper leg sensor suite configured to track the position, orientation, and joint angle of the right upper leg;
a right knee tracker with a right knee sensor suite configured to track the position, orientation, and joint angle of the right knee;

a right ankle tracker with a right ankle sensor suite configured to track the position, orientation, and joint angle of the right ankle; and combinations thereof.

9. The system for full-body tracking according to claim 8, wherein the at least one trackers including:

a head tracker with a head joint sensor suite configured to track the position, orientation, and joint angle of the head;

a left upper arm tracker with a left upper arm sensor suite configured to track the position, orientation, and joint angle of the left upper arm;

a left elbow tracker with a left elbow sensor suite configured to track the position, orientation, and joint angle of the left elbow;

a left wrist tracker with a left wrist sensor suite configured to track the position, orientation, and joint angle of the left wrist;

a right upper arm tracker with a right upper arm sensor suite configured to track the position, orientation, and joint angle of the right upper arm;

a right elbow tracker with a right elbow sensor suite configured to track the position, orientation, and joint angle of the right elbow;

a right wrist tracker with a right wrist sensor suite configured to track the position, orientation, and joint angle of the right wrist;

a hips tracker with a hips joint sensor suite configured to track the position, orientation, and joint angle of the hips;

a left upper leg tracker with a left upper leg sensor suite configured to track the position, orientation, and joint angle of the left upper leg;

a left knee tracker with a left knee sensor suite configured to track the position, orientation, and joint angle of the left knee;

a left ankle tracker with a left ankle sensor suite configured to track the position, orientation, and joint angle of the left ankle;

a right upper leg tracker with a right upper leg sensor suite configured to track the position, orientation, and joint angle of the right upper leg;

a right knee tracker with a right knee sensor suite configured to track the position, orientation, and joint angle of the right knee;

and a right ankle tracker with a right ankle sensor suite configured to track the position, orientation, and joint angle of the right ankle.

10. The system for full-body tracking according to claim 1, wherein the computational device is wired to each sensor suite of each of the at least one trackers, or the computational device is a separate device.

11. The system for full-body tracking according to claim 1, wherein the computational device is configured to communication with a headset and a controller for collecting position/orientation data, a headset location, and a controller location from the headset, the controller, or a combination thereof, wherein the headset and the controller are a VR/AR headset and a VR/AR controller, respectively.

12. The system for full-body tracking according to claim 1, wherein the computational device is configured to send the digitize poses and the body positions to a virtual reality or augmented reality application or a motion recording device configured for animation keyframes.

13. A system configured for full-body tracking comprising:

at least one tracker, each of the at least one trackers hosts a joint sensor suite configured to track positions, orientations, and joint angles of a joint along a body, and each of the at least one trackers is configured to be attached to the body, the at least one trackers including:

a head tracker with a head joint sensor suite configured to track the position, orientation, and joint angle of the head;

a left upper arm tracker with a left upper arm sensor suite configured to track the position, orientation, and joint angle of the left upper arm;

a left elbow tracker with a left elbow sensor suite configured to track the position, orientation, and joint angle of the left elbow;

a left wrist tracker with a left wrist sensor suite configured to track the position, orientation, and joint angle of the left wrist;

a right upper arm tracker with a right upper arm sensor suite configured to track the position, orientation, and joint angle of the right upper arm;

a right elbow tracker with a right elbow sensor suite configured to track the position, orientation, and joint angle of the right elbow;

a right wrist tracker with a right wrist sensor suite configured to track the position, orientation, and joint angle of the right wrist;

a hips tracker with a hips joint sensor suite configured to track the position, orientation, and joint angle of the hips;

a left upper leg tracker with a left upper leg sensor suite configured to track the position, orientation, and joint angle of the left upper leg;

a left knee tracker with a left knee sensor suite configured to track the position, orientation, and joint angle of the left knee;

a left ankle tracker with a left ankle sensor suite configured to track the position, orientation, and joint angle of the left ankle;

a right upper leg tracker with a right upper leg sensor suite configured to track the position, orientation, and joint angle of the right upper leg;

a right knee tracker with a right knee sensor suite configured to track the position, orientation, and joint angle of the right knee; and a right ankle tracker with a right ankle sensor suite configured to track the position, orientation, and joint angle of the right ankle;

the joint sensor suite for each of the at least one trackers including:

a magnetic field sensor on a first limb of the joint and at least one magnet on at least one second limb of the joint, the magnetic field sensor is a small-scale microelectromechanical system (MEMS) magnetic field sensor;

an accelerometer; and a gyroscope;

wherein the joint sensor suite for each of the at least one trackers is configured to track acceleration, orientation, magnetic field strength, and magnetic field polarity;

at least one wearable article, each of the at least one wearable articles is configured to enable one of the at least one trackers to be fastened to the joint along the body; and a computational device configured to capture real-time user generated movements via each of the at least one trackers and digitize user poses and body positions, the computational device is configured to calculate observed values for each joint of the body, wherein the observed values including a polarity of earth, a gravity vector, and skeletal bone lengths that are all assumed to be constant once they have been generated, whereby the observed values are configured to be leveraged to orient, calculate joint angles, error correct, and calibrate the system without any application driven requirements;

wherein the computational device is configured to calculate the joint angle, the joint orientation, the joint position, a parent joint position, and a child joint position in real-time, where the parent joint position is a proximal body joint that is closer on the limbs of a spine of the body, and the child joint position is a distal body joint that is further away from the spine;

wherein, the computational device is configured to capture the real-time user generated movements via each of the at least one trackers and digitize the user poses and the body positions without the need for external observers, lighthouses, or base stations, the computational device is a computer, a smartphone, a game system, a VR headset, an AR headset, or combinations thereof;

wherein the computational device is wired to each sensor suite of each of the at least one trackers, or the computational device is a separate device;

wherein the computational device is configured to communication with a headset and a controller for collecting position/orientation data, a headset location, and a controller location from the headset, the controller, or a combination thereof, the headset and the controller are a VR/AR headset and a VR/AR controller, respectively;

wherein the computational device is configured to send the digitize poses and the body positions to a virtual reality or augmented reality application or a motion recording device configured for animation keyframes;

wherein, the system is designed and configured to:
fulfill standard tracking requirements without requiring an existence of external observers, external light houses, or base stations;
track a position of the body from the placement and location of feet, legs, and arms when limbs overlap or cross;
track an actual position and angle of a joint instead of calculating possible locations given the position of trackers which simply know their own location;
capture pose data both in real-time and in recorded form;
not require a line of sight in order to operate;
not have location loss drifting that causes virtual body parts to fly away from virtual avatars when tracking is lost;
work with virtual reality and augmented reality devices without any modification to headsets or environments; and
track a position and orientation of a tracker which needs calibration to be linked to the skeleton, wherein the system is configured to allow for actual joint angles and orientations to be identified in real-time;
whereby the system is configured for full-body applications in virtual reality or augmented reality applications as well as recording pose data for motion capture, animation, and health and fitness applications.

14. A tracker device for full-body tracking in virtual reality and augmented reality applications comprising:
a joint sensor suite configured to track positions, orientations, and joint angles of a joint along a body,
the joint sensor suite for the tracker device includes a magnetic field sensor on a first limb of the joint and at least one magnet on at least one second limb of the joint;
wherein the magnetic field sensor is a small-scale microelectromechanical system (MEMS) magnetic field sensor; and
wherein the joint sensor suite for the tracker device is configured to track acceleration, orientation, magnetic field strength, and magnetic field polarity of the joint along the body.

15. The tracker device of claim 14, wherein the joint sensor suite further comprising:
an accelerometer; and
a gyroscope.

16. The tracker device of claim 14 further including a wearable article, the wearable article is configured to enable the tracker device to be fastened to the joint along the body.

17. The tracker device of claim 14, wherein the tracker device being selected from a group consisting of:
a head tracker with a head joint sensor suite configured to track the position, orientation, and joint angle of the head;
a left upper arm tracker with a left upper arm sensor suite configured to track the position, orientation, and joint angle of the left upper arm;
a left elbow tracker with a left elbow sensor suite configured to track the position, orientation, and joint angle of the left elbow;
a left wrist tracker with a left wrist sensor suite configured to track the position, orientation, and joint angle of the left wrist;
a right upper arm tracker with a right upper arm sensor suite configured to track the position, orientation, and joint angle of the right upper arm;
a right elbow tracker with a right elbow sensor suite configured to track the position, orientation, and joint angle of the right elbow;
a right wrist tracker with a right wrist sensor suite configured to track the position, orientation, and joint angle of the right wrist;
a hips tracker with a hips joint sensor suite configured to track the position, orientation, and joint angle of the hips;
a left upper leg tracker with a left upper leg sensor suite configured to track the position, orientation, and joint angle of the left upper leg;
a left knee tracker with a left knee sensor suite configured to track the position, orientation, and joint angle of the left knee;
a left ankle tracker with a left ankle sensor suite configured to track the position, orientation, and joint angle of the left ankle;
a right upper leg tracker with a right upper leg sensor suite configured to track the position, orientation, and joint angle of the right upper leg;
a right knee tracker with a right knee sensor suite configured to track the position, orientation, and joint angle of the right knee; and
a right ankle tracker with a right ankle sensor suite configured to track the position, orientation, and joint angle of the right ankle.

* * * * *